(12) United States Patent
Kodama

(10) Patent No.: US 11,434,087 B2
(45) Date of Patent: Sep. 6, 2022

(54) TRANSFER DEVICE, PROCESSING SYSTEM, AND TRANSFER METHOD

(71) Applicant: TOKYO ELECTRON LIMITED, Tokyo (JP)

(72) Inventor: Toshiaki Kodama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/174,755

(22) Filed: Feb. 12, 2021

(65) Prior Publication Data

US 2021/0253365 A1    Aug. 19, 2021

(30) Foreign Application Priority Data

Feb. 17, 2020 (JP) .............................. JP2020-024315

(51) Int. Cl.
*H01L 21/677* (2006.01)
*B65G 47/90* (2006.01)
*H01L 21/687* (2006.01)

(52) U.S. Cl.
CPC ........ *B65G 47/90* (2013.01); *H01L 21/67742* (2013.01); *H01L 21/67748* (2013.01); *H01L 21/68707* (2013.01)

(58) Field of Classification Search
CPC .......... H01L 21/67742; H01L 21/68707; B25J 17/0233
See application file for complete search history.

(56) References Cited

U.S. PATENT DOCUMENTS

| 5,378,145 | A * | 1/1995 | Ono | C23C 16/54 432/152 |
|---|---|---|---|---|
| 5,527,390 | A * | 6/1996 | Ono | C23C 16/54 118/719 |
| 10,005,190 | B2 * | 6/2018 | Ha | H01L 21/68707 |
| 10,894,326 | B2 * | 1/2021 | Hosek | B25J 9/042 |
| 2005/0285419 | A1 * | 12/2005 | Matsumoto | H01L 21/67742 294/213 |
| 2006/0216137 | A1 * | 9/2006 | Sakata | H01L 21/67766 414/222.13 |
| 2010/0239397 | A1 * | 9/2010 | Irie | H01L 21/67742 700/228 |
| 2017/0069517 | A1 * | 3/2017 | Goto | H01L 21/67778 |
| 2018/0099421 | A1 * | 4/2018 | Ogata | B25J 19/027 |
| 2018/0104820 | A1 * | 4/2018 | Troy | G01B 3/28 |
| 2018/0275192 | A1 * | 9/2018 | Yamada | G01R 31/2891 |

(Continued)

FOREIGN PATENT DOCUMENTS

| JP | H1177988 A | 7/1989 |
| JP | H09-213768 A | 8/1997 |

(Continued)

*Primary Examiner* — Gerald McClain
(74) *Attorney, Agent, or Firm* — Fenwick & West LLP

(57) ABSTRACT

A transfer device comprises a transfer arm to which a pick is attached and an inclination adjusting mechanism disposed below the transfer arm and configured to adjust an inclination of the transfer arm. The inclination adjusting mechanism includes an upper portion fixed to a lower portion of the transfer arm, a lower portion disposed below the upper portion to face the upper portion, a support portion that rotatably supports the upper portion with respect to the lower portion, and at least two actuators disposed between the upper portion and the lower portion.

10 Claims, 10 Drawing Sheets

(56) References Cited

U.S. PATENT DOCUMENTS

| | | | |
|---|---|---|---|
| 2019/0019719 A1* | 1/2019 | Atwood | H01L 21/67742 |
| 2020/0223074 A1* | 7/2020 | Bohle, II | B25J 11/005 |
| 2021/0239176 A1* | 8/2021 | Umino | B25J 17/0233 |

FOREIGN PATENT DOCUMENTS

| | | | | |
|---|---|---|---|---|
| JP | 2003264215 A | * | 9/2003 | |
| JP | 2009049200 A | * | 3/2009 | H01L 21/67742 |
| KR | 10-0289135 B1 | | 9/2001 | |

\* cited by examiner

TRANSFER DEVICE, PROCESSING SYSTEM, AND TRANSFER METHOD

CROSS-REFERENCE TO RELATED APPLICATION

This application claims priority to Japanese Patent Application No. 2020-024315, filed on Feb. 17, 2020, the entire contents of which are incorporated herein by reference.

TECHNICAL FIELD

The present disclosure relates to a transfer device, a processing system, and a transfer method.

BACKGROUND

A technique for adjusting an inclination of a transfer fork disposed at a tip end of an arm of a wafer transfer robot is known (see, e.g. Japanese Patent Application Publication No. H09-213768).

SUMMARY

The present disclosure provides a technique capable of finely adjusting an inclination of a transfer arm.

In accordance with an aspect of the present disclosure, there is provided a transfer device including: a transfer arm to which a pick is attached; and an inclination adjusting mechanism disposed below the transfer arm and configured to adjust an inclination of the transfer arm. The inclination adjusting mechanism includes: an upper portion fixed to a lower portion of the transfer arm; a lower portion disposed below the upper portion to face the upper portion; a support portion that rotatably supports the upper portion with respect to the lower portion; and at least two actuators disposed between the upper portion and the lower portion.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
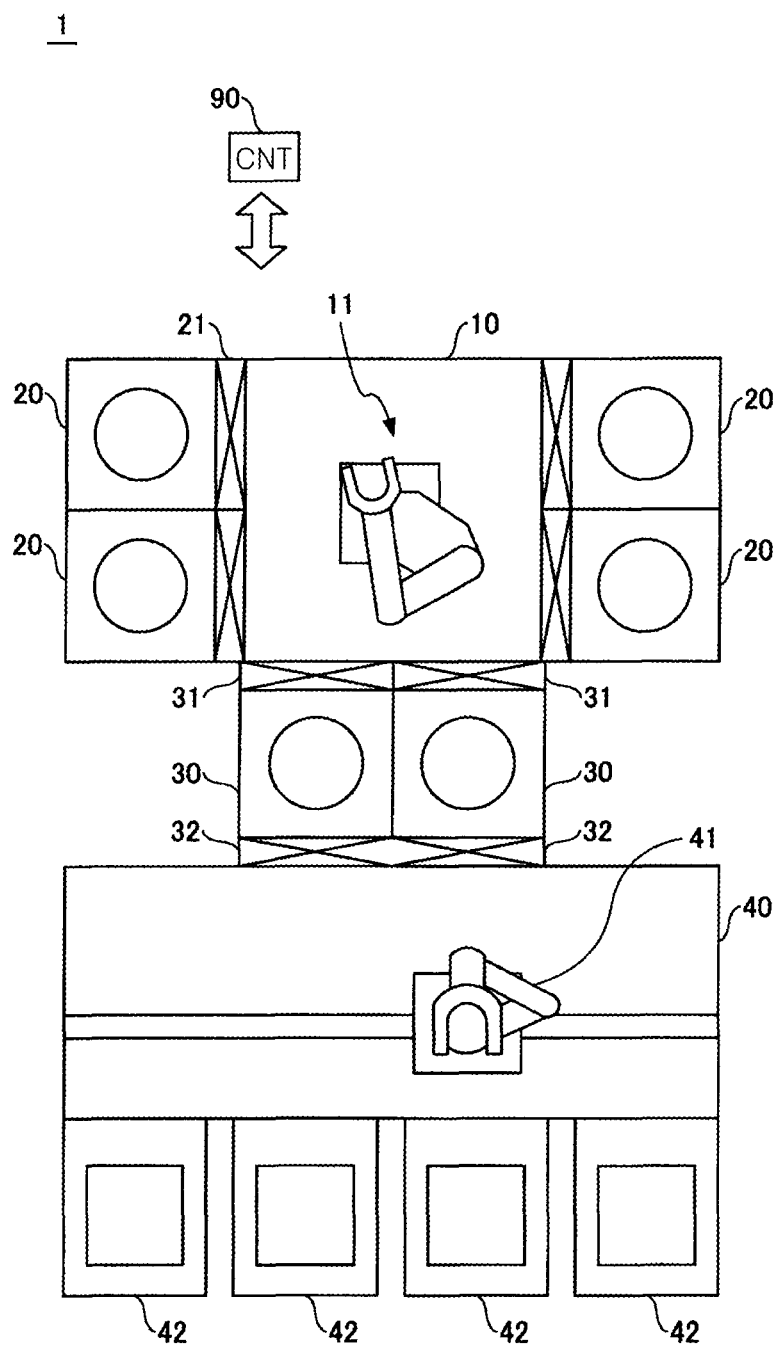
FIG. 1 shows an example of a processing system according to an embodiment.

Hereinafter, non-limiting exemplary embodiments of the present disclosure will be described in detail with reference to the accompanying drawings. Like reference numerals will be given to like or corresponding parts throughout the drawings, and redundant description thereof will be omitted.

(Processing System)

A processing system according to an embodiment will be described with reference to FIG. 1. FIG. 1 shows an example of the processing system according to one embodiment. In FIG. 1, the processing system is transparent so that the inner components can be seen for the sake of better understanding.

A processing system 1 includes a vacuum transfer chamber 10, a plurality of process chambers 20, a plurality of load-lock chambers 30, a loader module 40, and a controller (CNT) 90.

The plurality of process chambers 20 and the plurality of load-lock chambers 30 are connected to the vacuum transfer chamber 10. In the present embodiment, four process chambers 20 are connected to the vacuum transfer chamber 10. However, three or less process chambers 20 may be connected to the vacuum transfer chamber 10, or five or more process chambers 20 may be connected to the vacuum transfer chamber 10. Further, in the present embodiment, two load-lock chambers 30 are connected to the vacuum transfer chamber 10. However, one load-lock chamber 30 may be connected to the vacuum transfer chamber 10, or three or more load-lock chambers 30 may be connected to the vacuum transfer chamber 10.

A transfer device 11 is disposed in the vacuum transfer chamber 10. The inside of the vacuum transfer chamber 10 is maintained at a predetermined vacuum level. In the present embodiment, the transfer device 11 has three joints that can be driven independently. However, the transfer device 11 may have four or more joints that can be driven independently, or may have two joints that can be driven independently. Alternatively, the transfer device 11 may have one joint. The transfer device 11 takes out an unprocessed substrate from the load-lock chamber 30 depressurized to a predetermined vacuum level and transfers the unprocessed substrate into one of the process chambers 20. Further, the transfer device 11 takes out a processed substrate from the process chamber 20 and transfers the processed substrate into another process chamber 20 or the load-lock chamber 30. In the present embodiment, the substrate is a semiconductor wafer.

The process chambers 20 perform processing such as etching, film formation, or the like on the substrate in a low pressure environment. The process chambers 20 and the vacuum transfer chamber 10 are partitioned by openable and closable gate valves 21. The process chambers 20 are examples of a processing chamber. The process chambers 20 may be modules that execute the same process or different processes in a manufacturing process.

Each load-lock chamber 30 has a door 31 and a door 32. A pressure in each load-lock chamber 30 is switched between a predetermined vacuum level and an atmospheric pressure. The load-lock chambers 30 and the vacuum transfer chamber 10 are partitioned by the openable and closable doors 31. Further, the load-lock chambers 30 and the loader module 40 are partitioned by the openable and closable doors 32.

The loader module 40 is connected to the load-lock chambers 30. A transfer device 41 is disposed in the loader module 40. The loader module 40 is provided with a plurality of load ports 42 to which a container (e.g., front opening unified pod (FOUP)) capable of accommodating a plurality of unprossed or processed substrates is connected. In the present embodiment, the transfer device 41 has three joints that can be driven independently. However, the transfer device 41 may have four or more joints that can be driven independently, or may have two joints that can be driven independently. Alternatively, the transfer device 41 may have one joint. The transfer device 41 takes out an unprocessed substrate from the container connected to the load port 42 and transfers the unprocessed substrate into the load-lock chamber 30. Further, the transfer device 41 takes out a processed substrate from the load-lock chamber 30 whose inner pressure is returned to an atmospheric pressure and transfers the processed substrate into the container connected to the load port 42. The loader module 40 may be provided with an aligner (not shown) for adjusting a direction of the substrate taken out from the container connected to the load port 42.

The controller 90 controls operations of the respective components of the processing system 1. The controller 90 may be, e.g., a computer or the like. A program of the computer that operates the respective components of the processing system 1 is stored in a storage medium. The storage medium may be, e.g., a flexible disk, a compact disk, a hard disk, a flash memory, a DVD, or the like.

(Transfer Device)

Figure 2A:
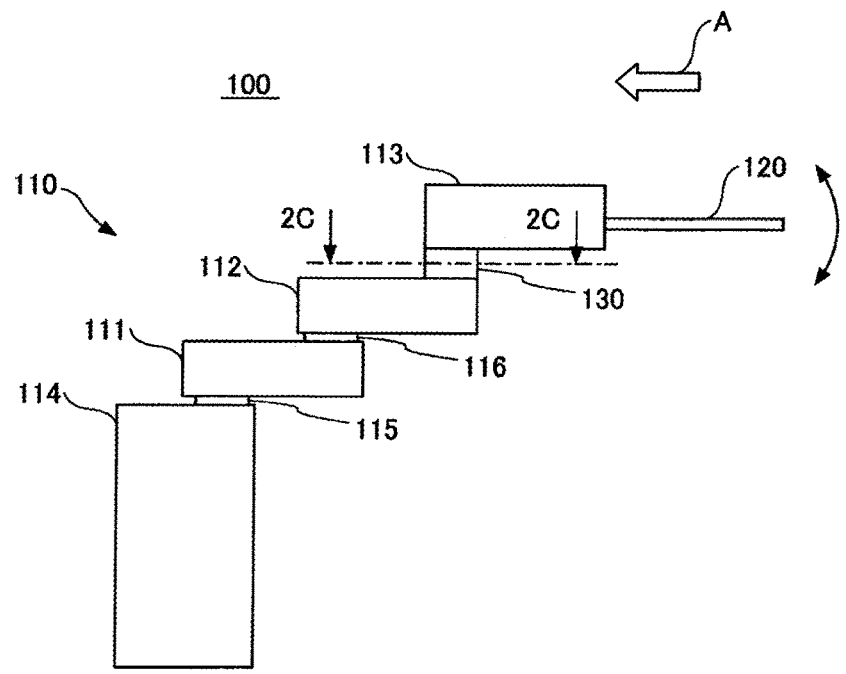
FIGS. 2A to 2C show an example of a transfer device.
Figure 2B:
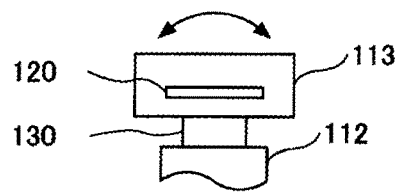
Figure 2C:
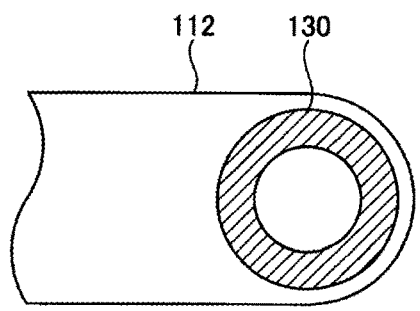

An example of the transfer device according to one embodiment will be described with reference to FIGS. 2A to 2C. FIGS. 2A to 2C show an example of the transfer device. FIG. 2A is a side view of the transfer device. FIG. 2B is a front view of the transfer device (viewed from a direction of arrow A in FIG. 2A). FIG. 2C is a cross-sectional view taken along a dash-dotted line 2C-2C shown in FIG. 2A.

A transfer device 100 can be used, e.g., as at least one of the transfer device 11 and the transfer device 41 in the processing system 1 of FIG. 1. The transfer device 100 includes an arm unit 110, a pick 120, and an inclination adjusting mechanism 130.

The arm unit 110 includes a first arm 111, a second arm 112, and a third arm 113. A base end portion of the first arm 111 is rotatably supported by a base 114 via a first joint portion 115. A base end portion of the second arm 112 is rotatably supported by the first arm 111 via a second joint portion 116. The third arm 113 is an example of a transfer arm, and a base end portion thereof is inclinably supported by the second arm 112 via the inclination adjusting mechanism 130.

The pick 120 is attached to a tip end of the third arm 113. The third arm 113 and the pick 120 may have an integral structure made of the same material. The pick 120 may be, e.g., a vacuum pick that vacuum-attracts and holds the substrate on an upper surface thereof. The pick 120 may be, e.g., an electrostatic pick that electrostatically attracts and holds the substrate on an upper surface thereof. When the pick 120 vacuum-attracts or electrostatically attracts the substrate, it is possible to prevent the substrate from being shifted or out of position on the pick 120 or falling from the pick 120 even if the arm unit 110 is driven at a high speed. Accordingly, a throughput can be improved, and the substrate can be transferred to an exact transfer destination. In the present embodiment, one pick 120 is attached to the third arm 113. However, two or more picks 120 may be attached to the third arm 113 in multiple stages. When the picks 120 are attached in multiple stages, multiple substrates can be transferred at one time, which improves productivity.

The inclination adjusting mechanism 130 adjusts the inclination of the third arm 113 with respect to the second arm 112. In the present embodiment, the inclination adjusting mechanism 130 has a hollow cylindrical shape, so that various cables, tubes, and the like can be inserted thereinto. For example, when the pick 120 is a vacuum pick, a tube for a vacuum chuck, or the like is inserted into the inclination adjusting mechanism 130. For example, when the pick 120 is an electrostatic pick, a cable for applying a voltage to an electrode of an electrostatic chuck, or the like is inserted into the inclination adjusting mechanism 130.

Figure 3A:
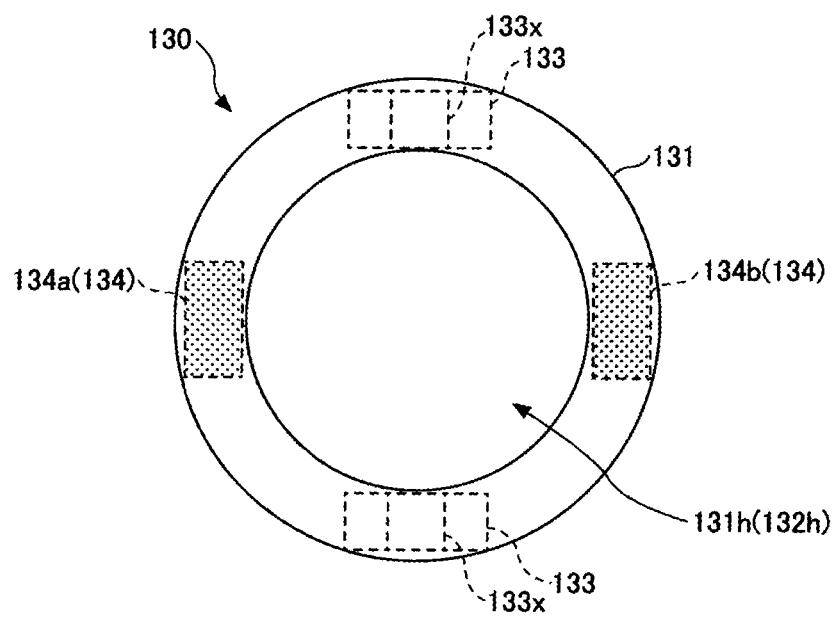
FIGS. 3A and 3B show an example of an inclination adjusting mechanism.
Figure 3B:
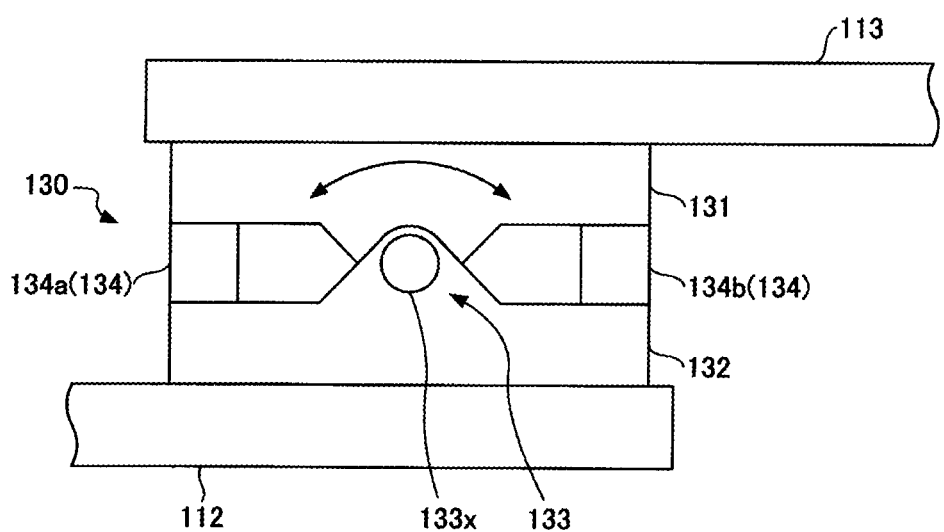

FIGS. 3A and 3B show an example of the inclination adjusting mechanism 130. FIG. 3A is a top view of the inclination adjusting mechanism 130 (viewed from the third arm 113). For convenience of description, the second arm 112 and the third arm 113 are omitted in FIG. 3A. FIG. 3B is a side view of the inclination adjusting mechanism 130.

The inclination adjusting mechanism 130 includes an upper portion 131, a lower portion 132, support portions 133, and actuators 134.

The upper portion 131 is fixed to a bottom surface of the base end portion of the third arm 113. In the present embodiment, the upper portion 131 has an annular shape having a through-hole 131h. The upper portion 131 is made of, e.g., aluminum or stainless steel.

The lower portion 132 is disposed below the upper portion 131 to face the upper portion 131. The lower portion 132 is fixed to an upper surface of a tip end of the second arm 112. In the present embodiment, similarly to the upper portion 131, the lower portion 132 has an annular shape having a through hole 132h in plan view. The lower portion 132 is made of, e.g., aluminum or stainless steel.

The support portions 133 rotatably support the upper portion 131 with respect to the lower portion 132. In the present embodiment, two support portions 133 are disposed at positions between the upper portion 131 and the lower portion 132 while facing each other in a circumferential direction of the upper portion 131 (the lower portion 132). Each of the support portions 133 has a rotation shaft 133x disposed along a short lateral direction of the third arm 113, and rotatably supports the upper portion 131 with respect to the lower portion 132.

At least two actuators 134 are disposed between the upper portion 131 and the lower portion 132. The upper portions of the actuators 134 are fixed to the bottom surface of the upper portion 131, and the lower portions of the actuators 134 are fixed to the upper surface of the lower portion 132. The actuators 134 are extended and contracted in response to a signal outputted by the controller 90 to adjust the distance between the bottom surface of the upper portion 131 and the upper surface of the lower portion 132 at the positions corresponding to the actuators 134. In the present embodiment, the two actuators 134 are disposed between the upper portion 131 and the lower portion 132 while facing each other at positions shifted by 90 degrees from the positions corresponding to the support portions 133 in the circumferential direction of the upper portion 131 (the lower portion 132). Hereinafter, one of the two actuators 134 may also be referred to as "actuator 134a" and the other one may also be referred to as "actuator 134b." The actuators 134 are preferably piezo actuators or artificial muscle using air pressure in view of ensuring a large load capacity.

Figure 4A:
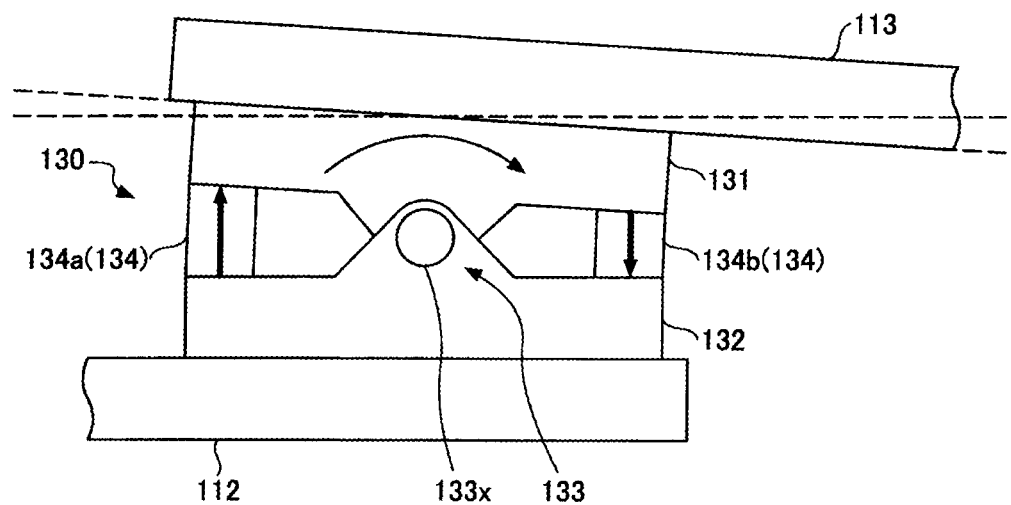
FIGS. 4A and 4B show an example of an operation of the inclination adjusting mechanism of FIG. 3.
Figure 4B:
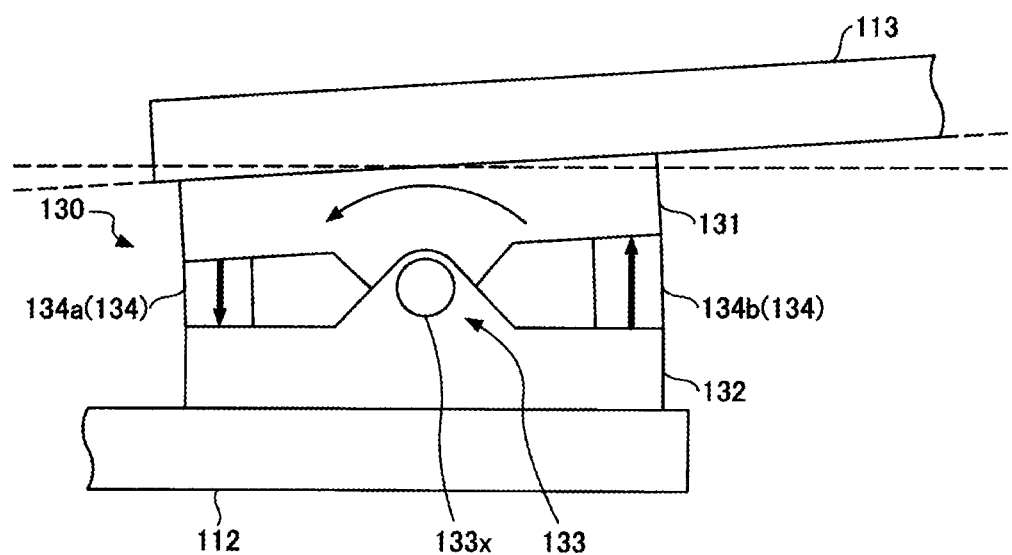

FIGS. 4A and 4B show an example of an operation of the inclination adjusting mechanism 130 of FIGS. 3A and B. For example, the controller 90 extends one actuator 134a and contracts the other actuator 134b, as shown in FIG. 4A. Therefore, the distance between the bottom surface of the upper portion 131 and the upper surface of the lower portion 132 at the position corresponding to one actuator 134a is increased, whereas the distance between the bottom surface of the upper portion 131 and the upper surface of the lower portion 132 at the position corresponding to the other actuator 134b is decreased. Accordingly, the tip end of the third arm 113 is inclined downward with respect to the base end. For example, when the upper portion 131 and the lower portion 132 have an outer diameter of 120 mm, if one actuator 134a is extended by about 0.2 mm and the other actuator 134b is contracted by about 0.2 mm, the third arm 113 is inclined forward by 0.2 degrees with respect to the second arm 112.

For example, the controller 90 contracts one actuator 134a and extends the other actuator 134b, as shown in FIG. 4B. Therefore, the distance between the bottom surface of the upper portion 131 and the upper surface of the lower portion 132 at the position corresponding to one actuator 134a is decreased, whereas the distance between the bottom surface of the upper portion 131 and the upper surface of the lower portion 132 at the position corresponding to the other actuator 134b is increased. Accordingly, the tip end of the third arm 113 is inclined upward with respect to the base end of the third arm 113.

In accordance with the inclination adjusting mechanism 130, the upper portion 131 is rotated with respect to the lower portion 132 about the support portions 133 utilizing the linear motion (extension and contraction) of the actuator 134. Accordingly, the inclination of the pick 120 (third arm 113) in the long longitudinal direction can be finely adjusted. Further, a large moment load can be controlled by a small actuator.

Since the inclination adjusting mechanism 130 is disposed at the base end of the third arm 113, the distance between the inclination adjusting mechanism 130 and the pick 120 is increased compared to the case where the inclination adjusting mechanism is disposed close to the pick 120 (at the tip end of the third arm 113). Accordingly, it is possible to reduce the influence of heat transfer to the inclination adjusting mechanism 130 by a high-temperature substrate, which may occur when the pick 120 transfers the high-temperature substrate.

Figure 5A:
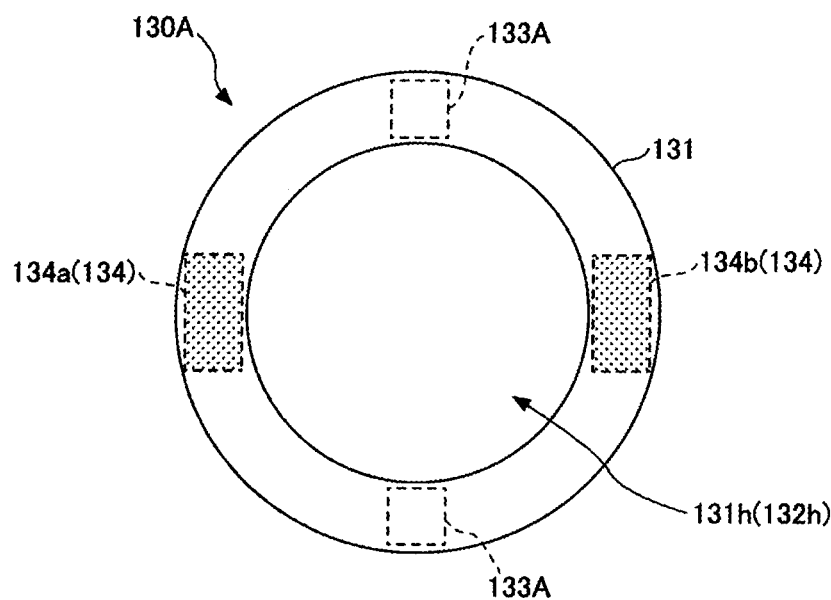
FIGS. 5A and 5B show a first modification of the inclination adjusting mechanism.
Figure 5B:
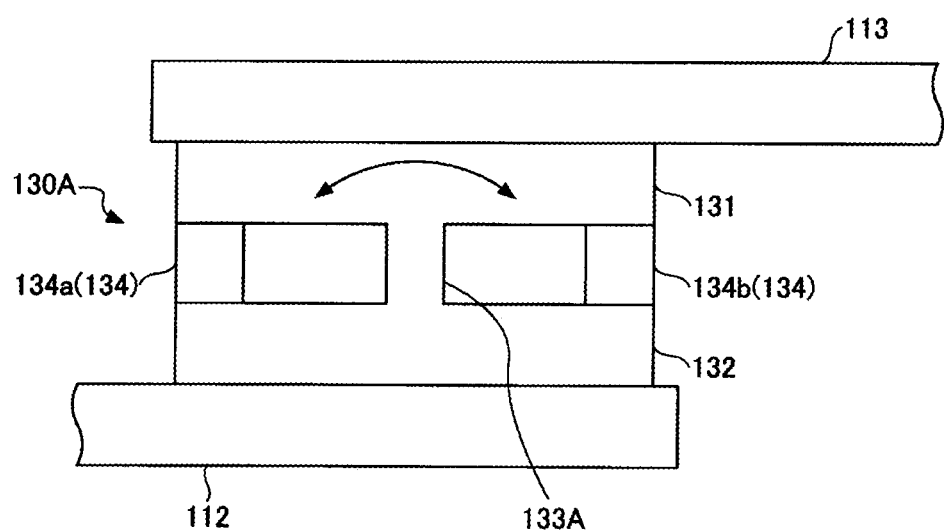

FIGS. 5A and 5B show a first modification of the inclination adjusting mechanism. FIG. 5A is a top view of the inclination adjusting mechanism (viewed from the third arm 113). For convenience of description, the second arm 112 and the third arm 113 are omitted in FIG. 5A. FIG. 5B is a side view of the inclination adjusting mechanism.

An inclination adjusting mechanism 130A shown in FIGS. 5A and 5B is different from the inclination adjusting mechanism 130 in that it includes support portions 133A that are members bent by an external force, instead of the support portions 133 having the rotation shaft 133x of the inclination adjusting mechanism 130 shown in FIGS. 3A and 3B. Since the other configurations are the same as those of the inclination adjusting mechanism 130, the difference between the inclination adjusting mechanism 130A and the inclination adjusting mechanism 130 will be mainly described below.

The inclination adjusting mechanism 130A has the upper portion 131, the lower portion 132, the support portions 133A, and the actuators 134.

The support portions 133A are members that are bent by an external force, and supports the upper portion 131 to be inclined with respect to the lower portion 132. In the present embodiment, two support portions 133A are disposed between the upper portion 131 and the lower portion 132 while facing each other in the circumferential direction of the upper portion 131 (the lower portion 132). The support portions 133A have, e.g., a prismatic shape, and are made of aluminum or stainless steel. In the present embodiment, the support portions 133A are integrally formed with the upper portion 131 and the lower portion 132. However, the support portions 133A may be integrally formed with either the upper portion 131 or the lower portion 132, or may be formed separately from the upper portion 131 and the lower portion 132.

Figure 6A:
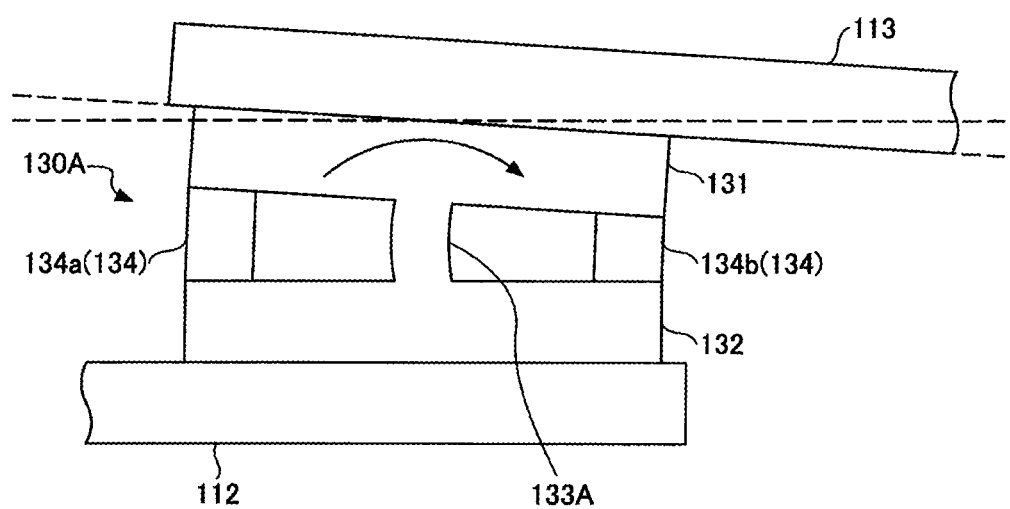
FIGS. 6A and 6B show an example of an operation of the inclination adjusting mechanism of FIG. 5.
Figure 6B:
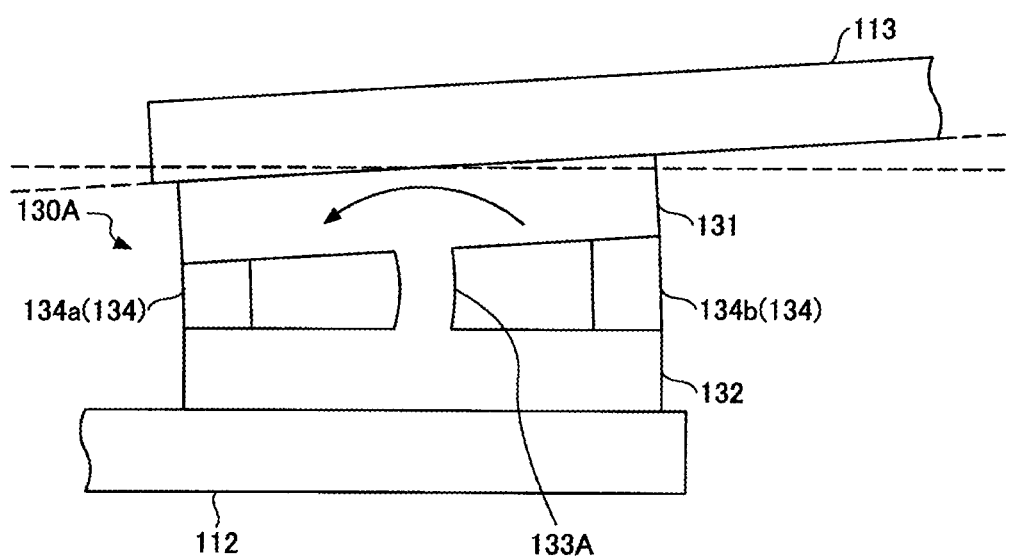

FIGS. 6A and 6B show an example of an operation of the inclination adjusting mechanism 130A of FIGS. 5A and 5B. For example, the controller 90 extends one actuator 134a and contracts the other actuator 134b, as shown in FIG. 6A. Accordingly, the support portions 133A are bent, and the distance between the bottom surface of the upper portion 131 and the upper surface of the lower portion 132 at the position corresponding to one actuator 134a increases. Further, the distance between the bottom surface of the upper portion 131 and the upper surface of the lower portion 132 at the position corresponding to the other actuator 134b decreases. Accordingly, the tip end of the third arm 113 is inclined downward with respect to the base end of the third arm 113.

For example, the controller 90 contracts one actuator 134a and extends the other actuator 134b, as shown in FIG. 6B. Accordingly, the support portions 133A are bent, and the distance between the bottom surface of the upper portion 131 and the upper surface of the lower portion 132 at the position corresponding to one actuator 134a decreases. Further, the distance between the bottom surface of the upper portion 131 and the upper surface of the lower portion 132 at the position corresponding to the other actuator 134b increases. Accordingly, the tip end of the third arm 113 is inclined upward with respect to the base end of the third arm 113.

In accordance with the inclination adjusting mechanism 130A, the upper portion 131 is inclined with respect to the lower portion 132 by bending the support portions 133A utilizing the linear motion (extension and contraction) of the actuator 134. Accordingly, the inclination of the pick 120 (the third arm 113) in the long longitudinal direction can be finely adjusted. Further, a large moment load can be controlled by a small actuator.

Since the inclination adjusting mechanism 130A is disposed at the base end of the third arm 113, the distance between the inclination adjusting mechanism 130A and the pick 120 is increased compared to the case where the inclination adjusting mechanism is disposed colose to the pick 120 (at the tip end of the third arm 113). Accordingly, it is possible to reduce the influence of heat transfer to the inclination adjusting mechanism 130A by a high-temperature substrate, which may occur when the pick 120 transfers the high-temperature substrate.

Figure 7A:
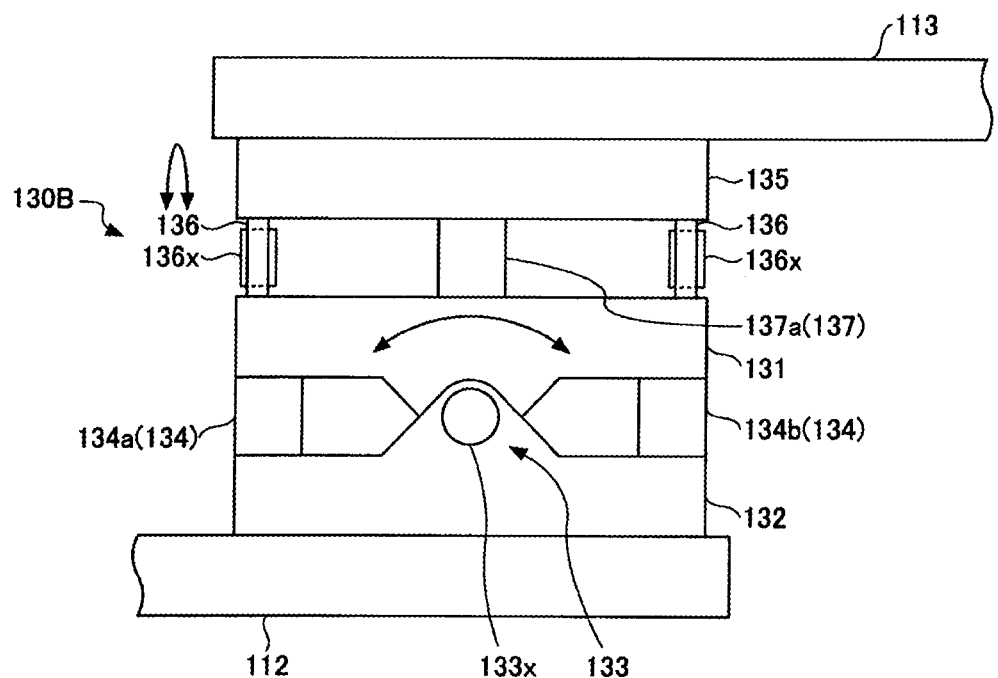
FIGS. 7A and 7B show a second modification of the inclination adjusting mechanism.
Figure 7B:
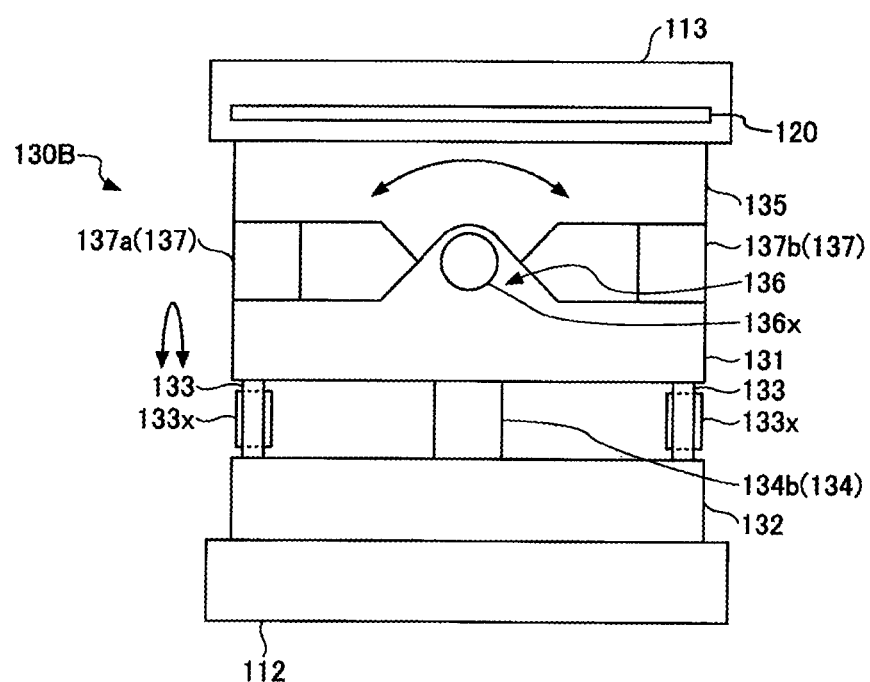

FIGS. 7A and 7B show a second modification of the inclination adjusting mechanism. FIG. 7A is a side view of the inclination adjusting mechanism (viewed from the lateral direction of the third arm 113), and FIG. 7B is a front view of the inclination adjusting mechanism (viewed from the tip end of the third arm 113).

An inclination adjusting mechanism 130B shown in FIGS. 7A and 7B is different from the inclination adjusting mechanism 130 in that a second upper portion 135, second support portions 136, and second actuators 137 are disposed between the third arm 113 and the upper portion 131 of the inclination adjusting mechanism 130 shown in FIGS. 3A and 3B. In accordance with the inclination adjusting mechanism 130B, the third arm 113 can be inclined in two rotational directions about the short lateral axis of the third arm 113 and the long longitudinal axis of the third arm 113. Since the other configurations are the same as those of the inclination adjusting mechanism 130, the differences between the inclination adjusting mechanism 130B and the inclination adjusting mechanism 130 will be mainly described below.

The inclination adjusting mechanism 130B has the upper portion 131, the lower portion 132, the support portions 133, the actuators 134, the second upper portion 135, the second support portions 136, and the second actuators 137.

The second upper portion 135 is fixed to the bottom surface of the base end of the third arm 113. In the present embodiment, similarly to the upper portion 131, the second upper portion 135 has an annular shape having a through-hole (not shown) in plan view.

The second support portions 136 rotatably support the second upper portion 135 with respect to the upper portion 131. In the present embodiment, two second support portions 136 are disposed between the second upper portion 135 and the upper portion 131 while facing each other at positions shifted by 90 degrees from the positions corresponding to the support portions 133 in the circumferential direction of the second upper portion 135 (the upper portion 131). Each of the second support portions 136 has a rotation shaft 136x disposed along the longitudinal direction of the third arm 113, and rotatably supports the second upper portion 135 with respect to the upper portion 131.

At least two second actuators 137 (137a and 137b) are disposed between the second upper portion 135 and the upper portion 131. The upper portions of the second actuators 137 are fixed to the bottom surface of the second upper portion 135, and the lower portions of the second actuators 137 are fixed to the upper surface of the upper portion 131. The second actuators 137 are extended and contracted based on the signal outputted by the controller 90 to adjust the distance between the bottom surface of the second upper portion 135 and the upper surface of the upper portion 131 at the positions corresponding to the second actuators 137. In the present embodiment, the two second actuators 137 are disposed between the second upper portion 135 and the upper portion 131 while facing each other at positions shifted by 90 degrees from the positions corresponding to the second support portions 136 in the circumferential direction of the second upper portion 135 (the upper portion 131). In other words, the two second actuators 137 are disposed between the second upper portion 135 and the upper portion 131 while facing each other at positions shifted by 90 degrees from the positions corresponding to the actuators 134 in the circumferential direction of the second upper portion 135 (the upper portion 131). Similarly to the actuators 134, the second actuators 137 are preferably piezo actuators or artificial muscle using air pressure in view of ensuring a large load capacity.

In accordance with the inclination adjusting mechanism 130B, the upper portion 131 is rotated with respect to the lower portion 132 about the support portions 133 utilizing the linear motion (extension and contraction) of the actuator 134. Accordingly, the inclination of the pick 120 (third arm 113) in the longitudinal direction can be finely adjusted. Further, the second upper portion 135 is rotated with respect to the upper portion 131 about the second support portions 136 utilizing the linear motion (extension and contraction) of the second actuators 137. Accordingly, the inclination of the pick 120 (third arm 113) in the lateral direction can be finely adjusted. In other words, in accordance with the inclination adjusting mechanism 130B, the inclination of the third arm 113 can be adjusted in the biaxial direction. Moreover, a large moment load can be controlled by a small actuator Since the inclination adjusting mechanism 130B is disposed at the base end of the third arm 113, the distance between the inclination adjusting mechanism 130B and the pick 120 becomes longer than that in the case where the inclination adjusting mechanism is disposed close to the pick 120 (at the tip end portion of the third arm 113). Accordingly, the influence of heat transfer to the inclination adjusting mechanism 130B by a high-temperature substrate, which may occur when the pick 120 transfers the high-temperature substrate, can be reduced.

Figure 8A:
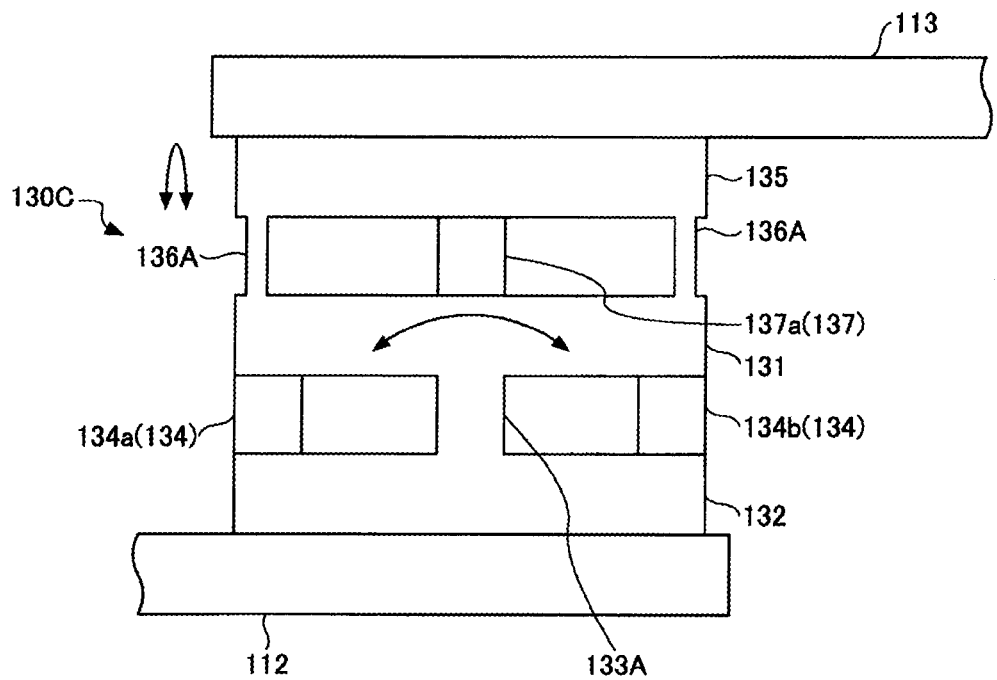
FIGS. 8A and 8B show a third modification of the inclination adjusting mechanism.
Figure 8B:
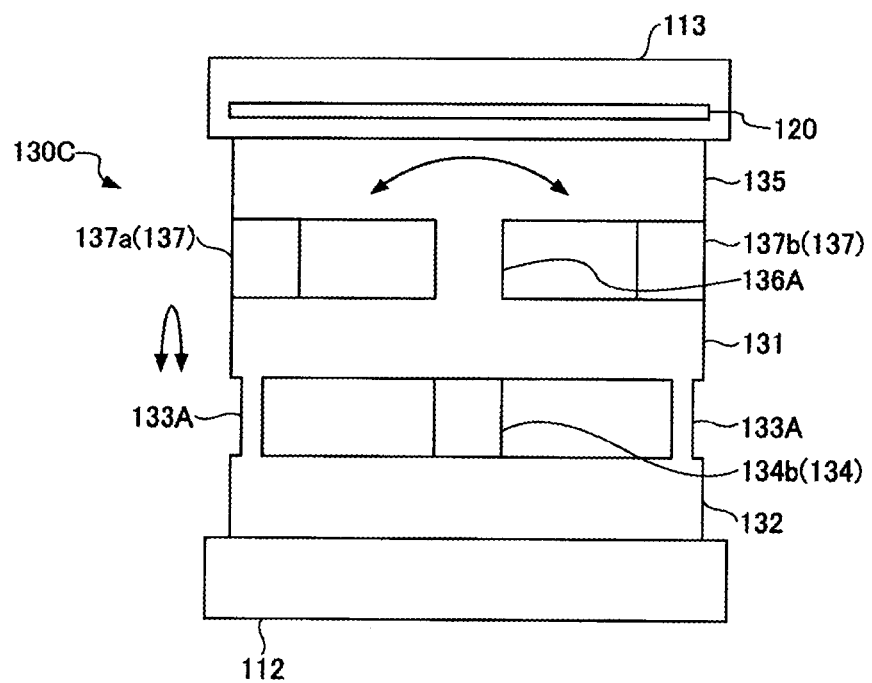

FIGS. 8A and 8B show a third modification of the inclination adjusting mechanism. FIG. 8A is a side view of the inclination adjusting mechanism (viewed from the lateral direction of the third arm 113), and FIG. 8B is a front view of the inclination adjusting mechanism (viewed from the tip end of the third arm 113).

An inclination adjusting mechanism 130C shown in FIGS. 8A and 8B is different from the inclination adjusting mechanism 130A in that the second upper portion 135, second support portions 136A, and the second actuators 137 are disposed between the third arm 113 and the upper portion 131 of the inclination adjusting mechanism 130A shown in FIG. 5. In accordance with the inclination adjusting device 130C, the third arm 113 can be inclined in the biaxial direction about the lateral axis and the longitudinal axis of the third arm 113. Since the other configurations are the same as those of the inclination adjusting mechanism 130A, the differences between the inclination adjusting mechanism 130C and the inclination adjusting mechanism 130A will be mainly described below.

The inclination adjusting mechanism 130C has the upper portion 131, the lower portion 132, the support portions 133A, the actuators 134, the second upper portion 135, the second support portions 136A, and the second actuators 137.

The second upper portion 135 is fixed to the bottom surface of the base end of the third arm 113. In the present embodiment, similarly to the upper portion 131, the second upper portion 135 has an annular shape having a-through hole (not shown) in plan view.

The second support portion 136A is a member that is bent by an external force, and inclinably supports the second upper portion 135 with respect to the upper portion 131. In the present embodiment, two second support portions 136A are disposed between the second upper portion 135 and the upper portion 131 while facing each other at positions shifted by 90 degrees from positions corresponding to the support portions 133A in the circumferential direction of the second upper portion 135 (upper portion 131). The second support portion 136A has, e.g., a prismatic shape, and is made of aluminum or stainless steel.

At least two second actuators 137 (137a and 137b) are disposed between the second upper portion 135 and the upper portion 131. The upper portions of the second actuators 137 are fixed to the bottom surface of the second upper portion 135, and the lower portions of the second actuators 137 are fixed to the upper surface of the upper portion 131. The second actuators 137 are extended and contracted based on the signal outputted by the controller 90 to reduce the distance between the bottom surface of the second upper portion 135 and the upper surface of the upper portion 131 at the positions corresponding to the second actuators 137. In the present embodiment, the second actuators 137 are disposed between the second upper portion 135 and the upper portion 131 while facing each other at positions shifted by 90 degrees from the positions corresponding to the second support portions 136A in the circumferential direction of the second upper portion 135 (the upper portion 131). In other words, the two second actuators 137 are disposed between the second upper portion 135 and the upper portion 131 while facing each other at positions shifted by 90 degrees from the positions corresponding to the actuators 134 in the circumferential direction of the second upper portion 135 (the upper portion 131). Similarly to the actuators 134, the second actuators 137 are preferably piezo actuators or artificial muscle using air pressure in view of ensuring a large load capacity.

In accordance with the inclination adjusting mechanism 130C, the upper portion 131 is inclined with respect to the lower portion 132 by bending the support portions 133A utilizing the linear motion (extension and contraction) of the actuator 134. Accordingly, the inclination of the pick 120 (the third arm 113) in the longitudinal direction can be finely adjusted. Further, the second upper portion 135 is inclined with respect to the upper portion 131 by bending the second support portions 136A utilizing the linear motion (extension and contraction) of the second actuators 137. Accordingly, the inclination of the pick 120 (third arm 113) in the lateral direction can be finely adjusted. In other words, in accordance with the inclination adjusting mechanism 130C, the inclination of the third arm 113 can be adjusted in the biaxial direction. Moreover, a large moment load can be controlled by a small actuator.

Since the inclination adjusting mechanism 130C is disposed at the base end of the third arm 113, the distance between the inclination adjusting mechanism 130C and the pick 120 becomes longer than that in the case where the inclination adjusting mechanism is disposed close to the pick 120 (at the tip end of the third arm 113). Accordingly, the influence of heat transfer to the inclination adjusting mechanism 130C by a high-temperature substrate, which may occur when the pick 120 transfers the high-temperature substrate, can be reduced.

Figure 9:
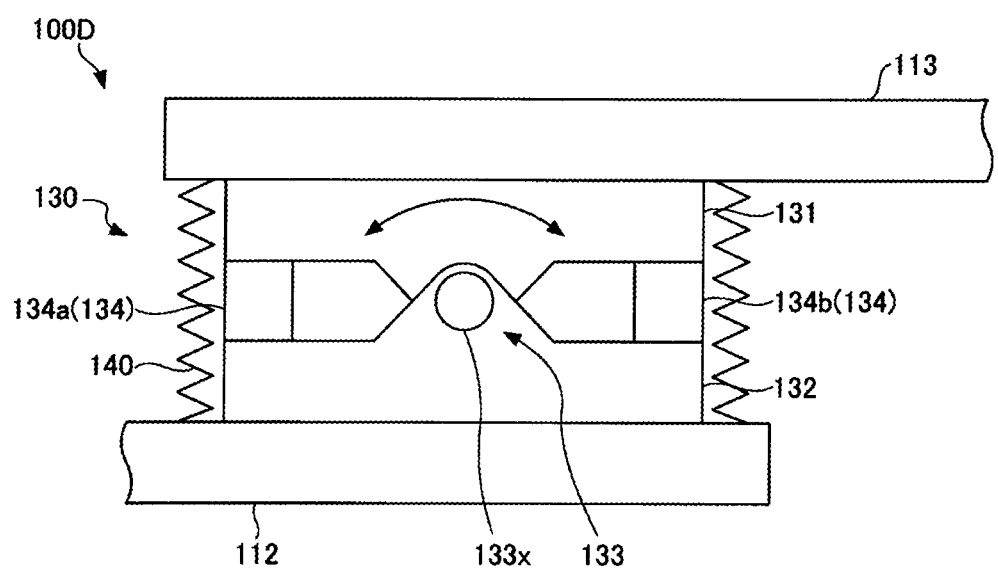
FIG. 9 shows another example of the transfer device.

FIG. 9 shows another example of the transfer device. FIG. 9 is a side view of the transfer device (viewed from the lateral direction of the third arm 113).

The transfer device 100D shown in FIG. 9 is different from the transfer device 100 in that an extensible/contractible body 140 is disposed around the inclination adjusting mechanism 130. Since the other configurations are the same as those of the transfer device 100, the differences between the transfer device 100D and the transfer device 100 will be mainly described below.

The extensible/contractible body 140 is disposed around the inclination adjusting mechanism 130 to cover the inclination adjusting mechanism 130. The extensible/contractible body 140 airtightly isolates an area where the inclination adjusting mechanism 130 is disposed from the outside. In the present embodiment, the extensible/contractible body 140 is a bellows having an upper end fixed to the bottom surface of the third arm 113, and a lower end fixed to the upper surface of the second arm 112.

In accordance with the transfer device 100D, since the extensible/contractible body 140 is disposed around the inclination adjusting mechanism 130, even when the transfer device 100D is disposed in a vacuum state, the inclination adjusting device 130 can be isolated from a vacuum atmosphere. Accordingly, it is possible to prevent particles, grease, or the like generated by the operation of the inclination adjusting mechanism 130 from being released to the vacuum atmosphere. Further, a coolant can be circulated in the area where the inclination adjusting mechanism 130 is disposed, so that it is possible to prevent the inclination adjusting mechanism 130 from reaching a high temperature.

The extensible/contractible body 140 may be disposed around the inclination adjusting mechanisms 130A to 130C to cover the inclination adjusting mechanisms 130A to 130C.

Figure 10:
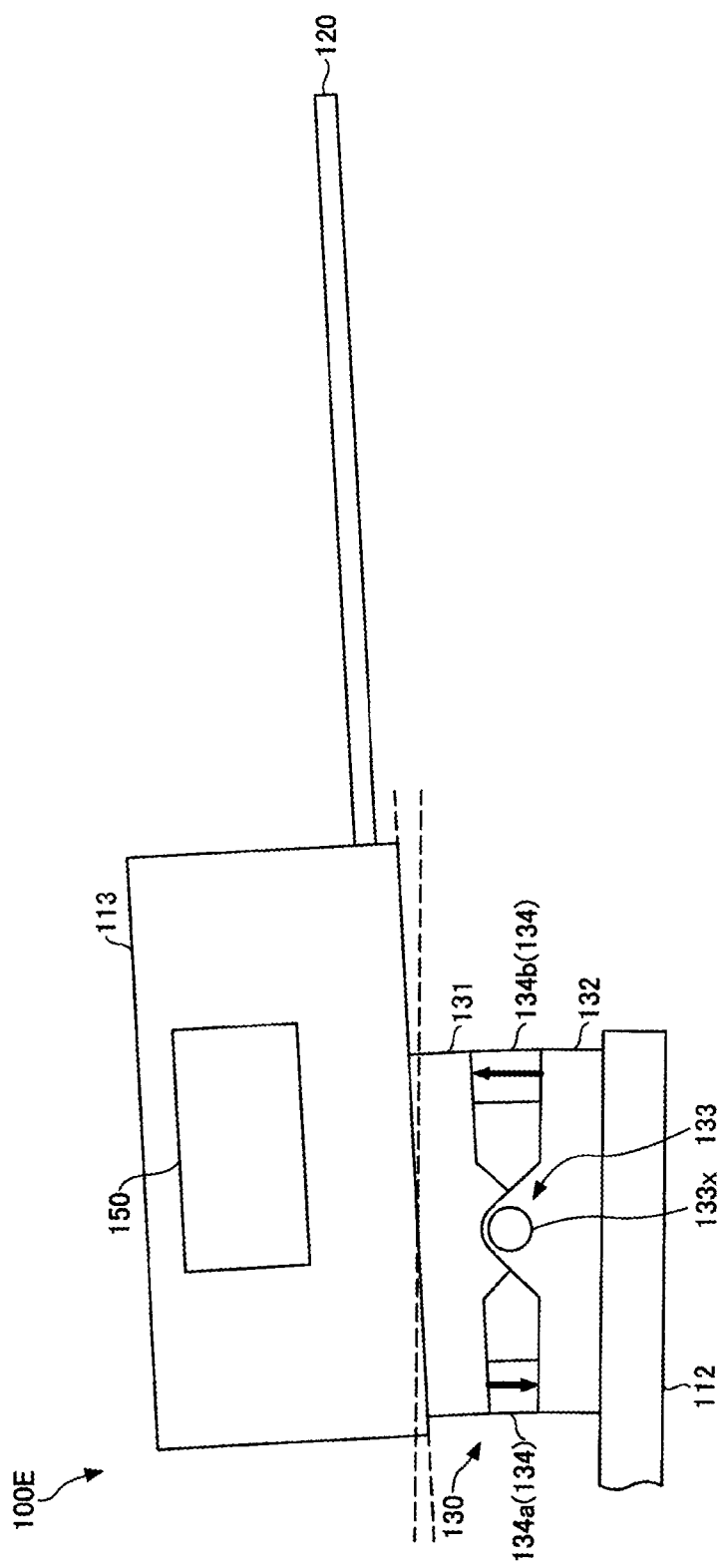
FIG. 10 shows still another example of the transfer device.

FIG. 10 shows still another example of the transfer device. FIG. 10 is a side view of the transfer device (viewed from the lateral direction of the third arm 113).

The transfer device 100E shown in FIG. 10 is different from the transfer device 100 in that it is attached to the third arm 113 and includes an inclination sensor 150 for measuring an inclination of the third arm 113. Since the other configurations are the same as those of the transfer device 100, the differences between the transfer device 100E and the transfer device 100 will be mainly described below.

The inclination sensor 150 is attached to the third arm 113. The inclination sensor 150 detects an inclination with respect to the horizontal plane and transmits the detection value to the controller 90. The inclination sensor 150 may be, e.g., a 1-axis acceleration sensor capable of detecting the inclination of the third arm 113 in the longitudinal direction. However, the inclination sensor 150 may be, e.g., a 2-axis acceleration sensor or a 3-axis acceleration sensor capable of detecting the inclination of the third arm 113 in the longitudinal direction and in the lateral direction.

The controller 90 adjusts the inclination of the third arm 113 (the pick 120) by extending/contracting the actuator 134 of the inclination adjusting mechanism 130 such that the detection value of the inclination sensor 150 becomes a predetermined target value. Then, the controller 90 controls the transfer device 100E to transfer the substrate using the third arm 113 (the pick 120) whose inclination is adjusted.

The inclination sensor 150 may be attached to the third arm 113 of the inclination adjusting mechanisms 130A to 130C.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

In the above embodiment, the case where the substrate is a semiconductor wafer has been described. However, the present disclosure is not limited thereto, and the substrate may be, e.g., a large substrate for a flat panel display (FPD), a substrate for an organic EL panel, a substrate for a solar cell, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A transfer device comprising:
a transfer arm to which a pick is attached; and
an inclination adjusting mechanism disposed below the transfer arm and configured to adjust an inclination of the transfer arm,
wherein the inclination adjusting mechanism includes:
an upper portion fixed to a lower portion of the transfer arm;

a lower portion disposed below the upper portion to face the upper portion;
a support portion that rotatably supports the upper portion with respect to the lower portion so that the upper portion is rotated with respect to the lower portion in a side view of the inclination adjusting mechanism; and
at least two actuators disposed between the upper portion and the lower portion,
wherein the inclination adjusting mechanism has a hollow cylindrical shape, the upper portion and the lower portion have an annular shape in a plan view of the inclination adjusting mechanism, and through-holes are formed through the upper portion and the lower portion.

2. The transfer device of claim 1, wherein the transfer device is disposed in a vacuum state.

3. The transfer device of claim 1, further comprising:
an inclination sensor attached to the transfer arm and configured to measure an inclination of the transfer arm.

4. The transfer device of claim 1, wherein the support portion has a rotation shaft.

5. The transfer device of claim 1, wherein the support portion is a member that is bent by an external force.

6. The transfer device of claim 1, wherein at least one of the at least two actuators is a piezo actuator or artificial muscle using air pressure.

7. The transfer device of claim 1, further comprising:
an extensible/contractible body disposed around the inclination adjusting mechanism to cover the inclination adjusting mechanism.

8. The transfer device of claim 7, wherein the extensible/contractible body is a bellows.

9. A processing system comprising:
a processing chamber where a substrate is accommodated and processed; and
a transfer device configured to transfer the substrate accommodated in the processing chamber,
wherein the transfer device includes:
a transfer arm attached to a pick configured to hold the substrate; and
an inclination adjusting mechanism disposed below the transfer arm and configured to adjust an inclination of the transfer arm,
wherein the inclination adjusting mechanism includes:
an upper portion fixed to a lower portion of the transfer arm;
a lower portion disposed below the upper portion to face the upper portion;
a support portion that rotatably supports the upper portion with respect to the lower portion so that the upper portion is rotated with respect to the lower portion in a side view of the inclination adjusting mechanism; and
at least two actuators disposed between the upper portion and the lower portion,
wherein the inclination adjusting mechanism has a hollow cylindrical shape, the upper portion and the lower portion have an annular shape in a plan view of the inclination adjusting mechanism, and through-holes are formed through the upper portion and the lower portion.

10. A transfer method for transferring a substrate using a transfer device,
wherein the transfer device includes:
a transfer arm attached to a pick; and
an inclination adjusting mechanism disposed below the transfer arm and configured to adjust an inclination of the transfer arm,
wherein the inclination adjusting mechanism has:
an upper portion fixed to a lower portion of the transfer arm;
a lower portion disposed below the upper portion to face the upper portion;
a support portion that rotatably supports the upper portion with respect to the lower portion; and
at least two actuators disposed between the upper portion and the lower portion,
wherein the upper portion and the lower portion have an annular shape in a plan view of the inclination adjusting mechanism, and through-holes are formed through the upper portion and the lower portion,
the transfer method comprising:
adjusting an inclination of the transfer arm by extending and contracting the at least two actuators so that the upper portion is rotated with respect to the lower portion in a side view of the inclination adjusting mechanism; and
transferring the substrate using the transfer arm whose inclination is adjusted.

* * * * *